United States Patent
Fan et al.

(10) Patent No.: US 9,716,499 B2
(45) Date of Patent: Jul. 25, 2017

(54) CURRENT AMPLIFIER AND TRANSMITTER USING THE SAME

(71) Applicant: MediaTek Inc., Hsin-Chu (TW)

(72) Inventors: Tsun-Yuan Fan, Tianwei Township, Changhua County (TW); Wen-Hua Chang, Tainan (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

(21) Appl. No.: 14/962,560

(22) Filed: Dec. 8, 2015

(65) Prior Publication Data

US 2016/0087632 A1 Mar. 24, 2016

Related U.S. Application Data

(63) Continuation-in-part of application No. 13/910,615, filed on Jun. 5, 2013, now Pat. No. 9,374,046.
(Continued)

(51) Int. Cl.
*H03F 3/04* (2006.01)
*H03K 19/0175* (2006.01)
(Continued)

(52) U.S. Cl.
CPC ....... *H03K 19/017509* (2013.01); *H03F 3/19* (2013.01); *H03F 3/45188* (2013.01);
(Continued)

(58) Field of Classification Search
CPC . H03F 3/45; H03F 3/343; H03F 3/345; H03F 2200/84; H03F 2200/87; H03F 2200/91; H03F 2200/151; H03F 2203/21148; H03F 2203/45054; H03F 2203/45182; H03F 3/16; H03F 3/45273; G05F 3/26
(Continued)

(56) References Cited

U.S. PATENT DOCUMENTS 4,743,862 A * 5/1988 Scheinberg ........... H03F 3/3455
330/253
5,451,901 A 9/1995 Welland
(Continued)

FOREIGN PATENT DOCUMENTS

CN 101904090 A 12/2010

OTHER PUBLICATIONS

Gupta, T., et al.; "A Sub-2W 10GBase-T Analog Front-End in 40nm CMOS Process;" IEEE International Solid-State Circuits Conference; Session 24; 10GBase-T and Optical Frontends; 2012; pp. 410-412.
(Continued)

*Primary Examiner* — Steven J Mottola
*Assistant Examiner* — Hafizur Rahman
(74) *Attorney, Agent, or Firm* — McClure, Qualey & Rodack, LLP

(57) ABSTRACT

A current amplifier and a transmitter using the same. The current amplifier has a first and second transistor and a voltage level shifting unit. The first transistor has a gate receiving an input current and a drain receiving a driving current. The voltage level shifting unit providing a voltage shift is coupled between the drain of the first transistor and the gate of the second transistor. An output current is generated at the drain of the second transistor.

23 Claims, 17 Drawing Sheets

Related U.S. Application Data

(60) Provisional application No. 62/192,154, filed on Jul. 14, 2015.

(51) Int. Cl.
*H03F 3/19* (2006.01)
*H04B 1/04* (2006.01)
*H03F 3/45* (2006.01)
*G05F 3/26* (2006.01)

(52) U.S. Cl.
CPC ..... *H03F 3/45273* (2013.01); *H03F 3/45659* (2013.01); *H04B 1/04* (2013.01); *G05F 3/26* (2013.01); *H03F 2200/84* (2013.01); *H03F 2200/91* (2013.01); *H03F 2203/45008* (2013.01); *H03F 2203/45082* (2013.01); *H03F 2203/45418* (2013.01); *H03F 2203/45481* (2013.01); *H04B 2001/0408* (2013.01)

(58) Field of Classification Search
USPC ....... 330/75, 87, 89, 98–105, 184, 257, 271, 330/288, 291, 310, 311; 326/82; 327/51–53, 108; 341/135; 323/315; 365/185.21
See application file for complete search history.

(56) References Cited

U.S. PATENT DOCUMENTS

| | | |
|---|---|---|
| 7,292,097 B2 * | 11/2007 | Taylor .................. H03F 1/486 330/282 |
| 7,312,662 B1 | 12/2007 | Roo et al. |
| 7,459,895 B2 | 12/2008 | Tokumitsu et al. |
| 7,876,158 B2 | 1/2011 | Chow et al. |
| 8,791,758 B1 | 7/2014 | Foroudi |
| 2006/0139100 A1 | 6/2006 | Taylor |
| 2008/0310046 A1 * | 12/2008 | Menegoli .............. H03F 1/0227 360/75 |
| 2010/0148871 A1 | 6/2010 | Lee et al. |
| 2010/0330938 A1 | 12/2010 | Yin |
| 2013/0082776 A1 | 4/2013 | Sugimoto |

OTHER PUBLICATIONS

Gerfers, F., et al.; "A 16-Port FCC-Compliant 10GBase-T Transmitter and Hybrid with 76dBc SFDR up to 400MHz Scalable to 48 Ports;" IEEE International Solid-State Circuits Conference; Session 24; 10GBase-T and Optical Frontends; 2012; pp. 412-414.

Fan, T.Y., et al.; "A 0.11mm2 150mW 10G Base-T Transmitter in 28nm CMOS Process;" Nov. 2015; pp. 1-4.

* cited by examiner

CURRENT AMPLIFIER AND TRANSMITTER USING THE SAME

CROSS REFERENCE TO RELATED APPLICATIONS

This application is a Continuation-In-Part of application Ser. No. 13/910,615, filed on Jun. 5, 2013, and also claims the benefit of U.S. Provisional Application No. 62/192,154, filed on Jul. 14, 2015, the entirety of which are incorporated by reference herein.

BACKGROUND OF THE INVENTION

Field of the Invention

The present invention relates to current amplifiers and transmitters.

Description of the Related Art

Nowadays, the need for high data-rate and long-distance transmission is emerging in modern communication systems. As a consequence, a high-speed and high-linear transmitter is more and more important. A current-steering digital-to-analog converter (DAC) is a good candidate for implementing a high-speed and high-resolution transmitter, but it is difficult to design a current mode DAC to operate satisfactorily with both large output swings and low distortions at high operating frequencies.

BRIEF SUMMARY OF THE INVENTION

Current amplifiers and transmitters using the current amplifiers are disclosed. In the disclosed transmitter, a current amplifier with high linearity is coupled to a current mode DAC to reduce the output swing of the DAC without affecting the transmission efficiency.

A current amplifier in accordance with an exemplary embodiment of the invention comprises a first and second transistor and a voltage level shifting unit. The first transistor has a gate receiving an input current, a drain receiving a driving current, and a source. The second transistor has a gate, a source and a drain. The voltage level shifting unit provides a voltage shift and is coupled between the drain of the first transistor and the gate of the second transistor. The current amplifier generates an output current at the drain of the second transistor. In another exemplary embodiment, a transmitter comprising the current amplifier and a single-ended digital-to-analog converter is disclosed. The single output of the single-ended digital-to-analog converter is coupled to the gate of the first transistor of the current amplifier. The design of the transmitter is a single ended design.

In some exemplary embodiments, the voltage shift provided by the voltage level shifting unit is utilized to ensure that the first transistor operates in a saturation region.

In another exemplary embodiment, a current amplifier in a pseudo-differential structure is disclosed, which comprises a first transistor, a second transistor, a third transistor, a fourth transistor, and a voltage level shifting unit. The first transistor has a gate receiving a positive input current, a drain receiving a first driving current, and a source. The second transistor has a gate, a source and a drain. The third transistor has a gate receiving a negative input current, a drain receiving a second driving current, and a source. The fourth transistor has a gate, a source and a drain. The voltage level shifting unit provides a first voltage shift and is coupled between the drain of the first transistor and the gate of the second transistor, and further provides a second voltage shift and is coupled between the drain of the third transistor and the gate of the fourth transistor. The current amplifier generates a negative output current and a positive output current at the drain of the second transistor and the drain of the third transistor, respectively. In another exemplary embodiment, a transmitter comprising the pseudo-differential current amplifier and a differential digital-to-analog converter is disclosed. The differential digital-to-analog converter has a positive output terminal coupled to the gate of the first transistor of the current amplifier and has a negative output terminal coupled to the gate of the third transistor of the current amplifier. The transmitter is in a differential structure.

In some exemplary embodiments, the first voltage shift provided by the voltage level shifting unit is utilized to ensure that the first transistor operates in a saturation region and the second voltage shift provided by the voltage level shifting unit is utilized to ensure that the third transistor operates in the saturation region.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description shows several exemplary embodiments of carrying out the invention. This description is made for the purpose of illustrating the general principles of the invention and should not be taken in a limiting sense. The scope of the invention is best determined by reference to the appended claims.

Figure 1:
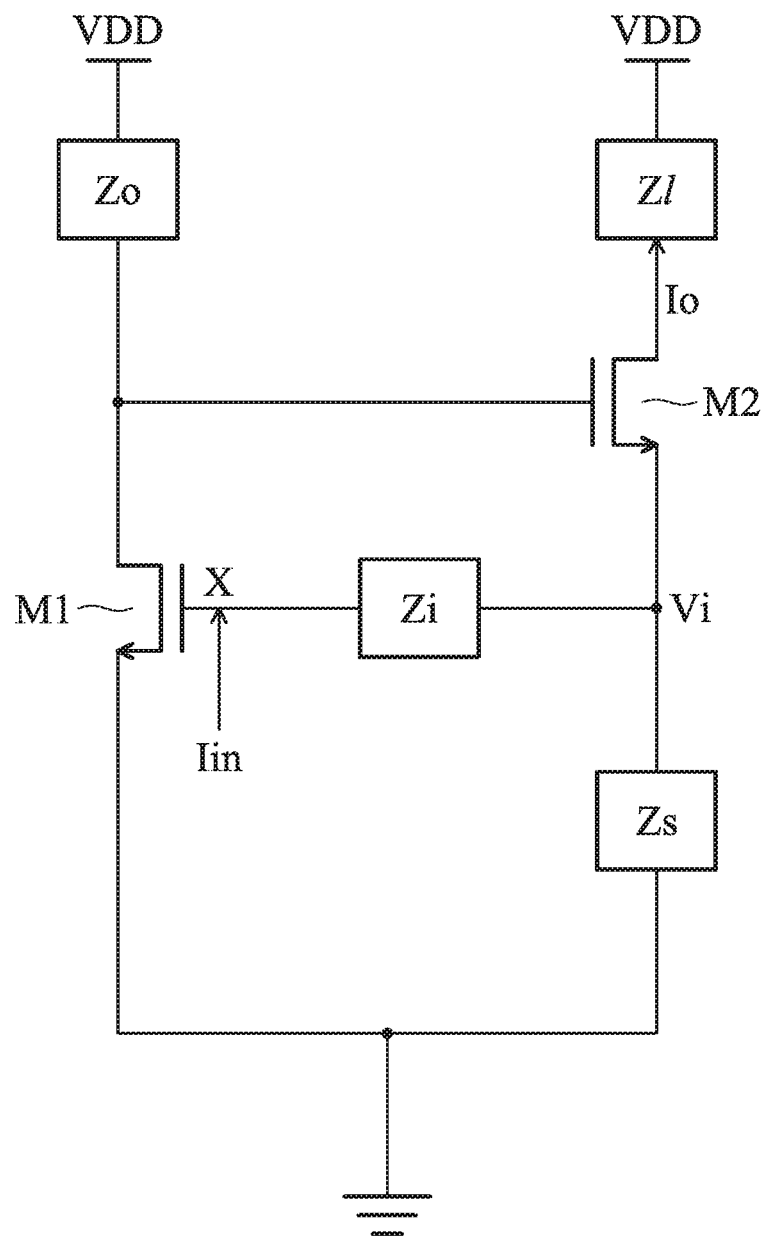
FIG. 1 depicts a current amplifier in accordance with an exemplary embodiment of the invention.

FIG. 1 depicts a current amplifier in accordance with an exemplary embodiment of the invention, which comprises at least two transistors M1 and M2 and at least two impedance circuits Zi and Zs. The transistor M1 has a gate coupled to a former-stage circuit via node X. As shown, the former-stage circuit provides the current amplifier with an input current Iin. Furthermore, the transistor M1 has a drain coupled to a current source (simplified to an impedance element Zo) and has a source biased at a constant voltage level (e.g., ground, but not limited thereto). The transistor M2 has a gate coupled to the current source (Zo) and has a source and a drain. The impedance circuit Zi is coupled between the gate of the transistor M1 and the source of the transistor M2. The impedance circuit Zs is coupled between the source of the transistor M2 and the ground terminal. According to the received input current Iin, the current amplifier generates an output current To at the drain of the transistor M2. A load impedance Zl may be coupled at the drain of the transistor M2 and thereby the output current To can be transformed into a voltage value.

The transistors M1 and M2 and the impedance structures Zo, Zi and Zs form a negative feedback loop. Thus, the node X is AC grounded—just a very small AC signal, due to loop gain, exists. Thus, Vi=−Iin*Zi, and Io=(Vi/Zs)−Ii=·[(−Ii*Zi)/Zs−Iin]. A current gain, (1+Zi/Zs), between Ii and Io is generated.

Note that no current source is connected to the source of the transistor M1. The voltage level of the source of the transistor M1 is kept constant by a constant voltage bias rather than a common mode bias design. Thus, the disclosed current amplifier works well in single ended applications.

Figure 2:
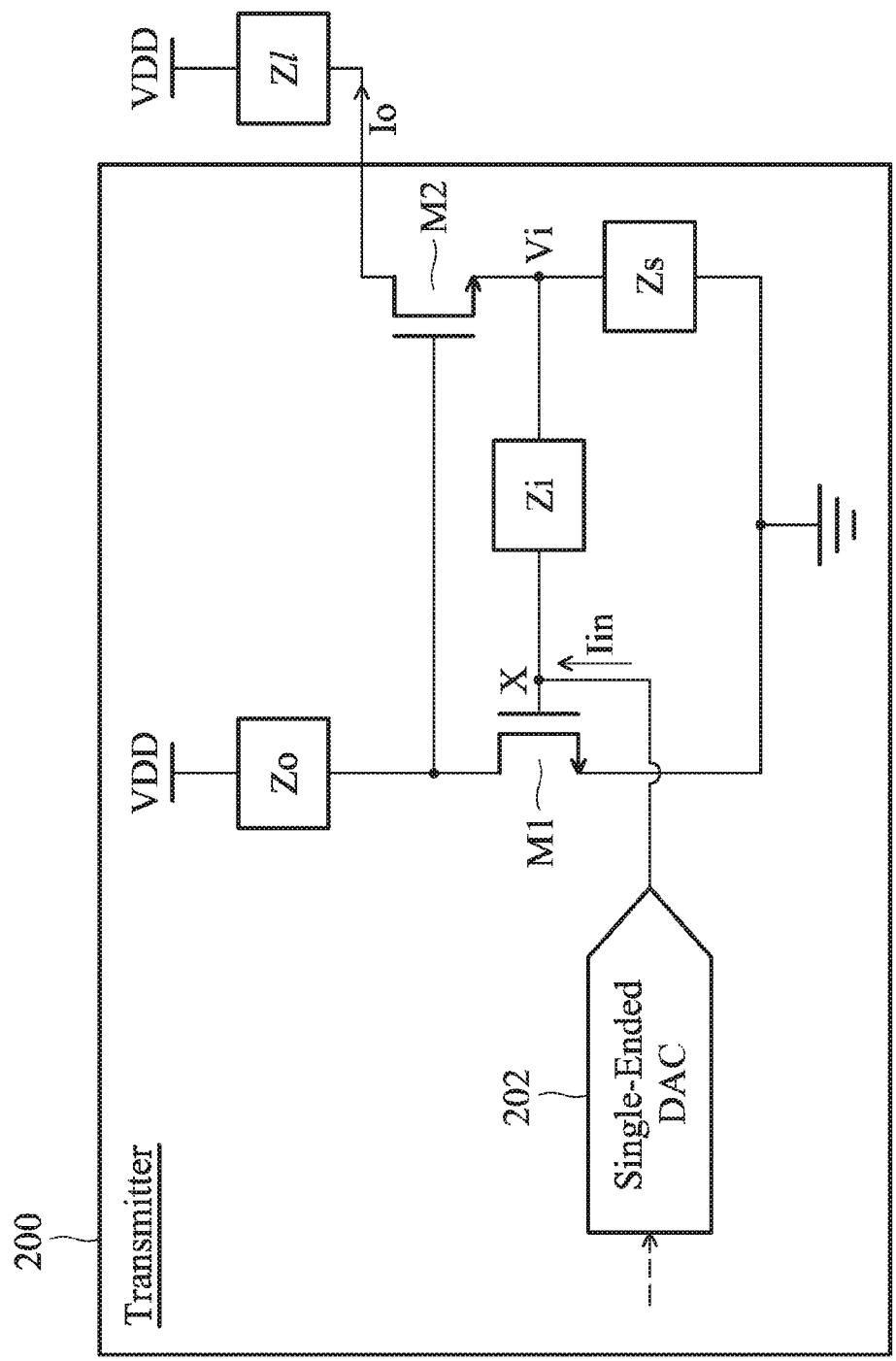
FIG. 2 depicts a single ended design transmitter 200.

FIG. 2 depicts a single ended design transmitter 200. The transmitter 200 comprises the current amplifier of FIG. 1 and a single-ended digital-to-analog converter 202. The single output of the single-ended digital-to-analog converter 202 is coupled to the gate of the transistor M1 of the current amplifier. Via node X, the single-ended digital-to-analog converter 202 provides the current amplifier with an input current Iin, and a single output current Io is generated by the current amplifier and coupled to the load impedance Zl for current-to-voltage transformation. When applied to transmission operations, low noise and high bandwidth are achieved by the current amplifier of FIG. 1, because no active device is required at the source of the transistor M1 of the current amplifier.

Figure 3A:
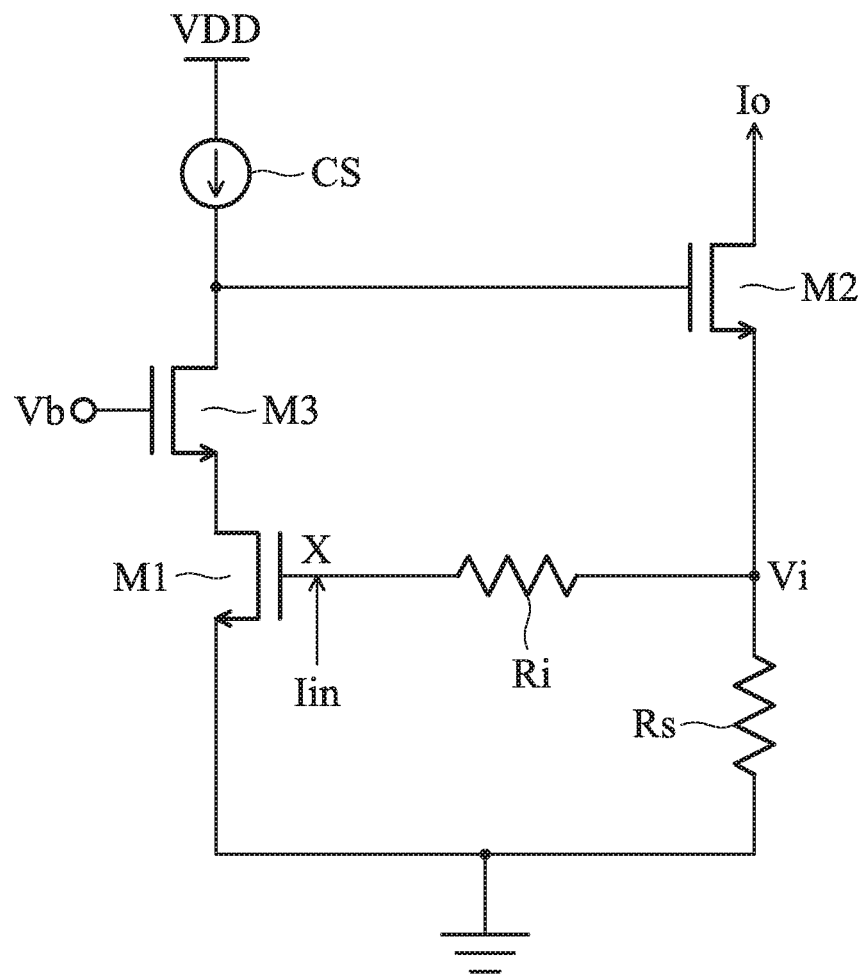
FIGS. 3A to 3C show several current amplifiers, wherein a transistor M3 is provided, having a gate biased at a bias voltage Vb, a source coupled to the drain of the transistor M1, and a drain coupled to the current source CS with the gate of the transistor M2.
Figure 3B:
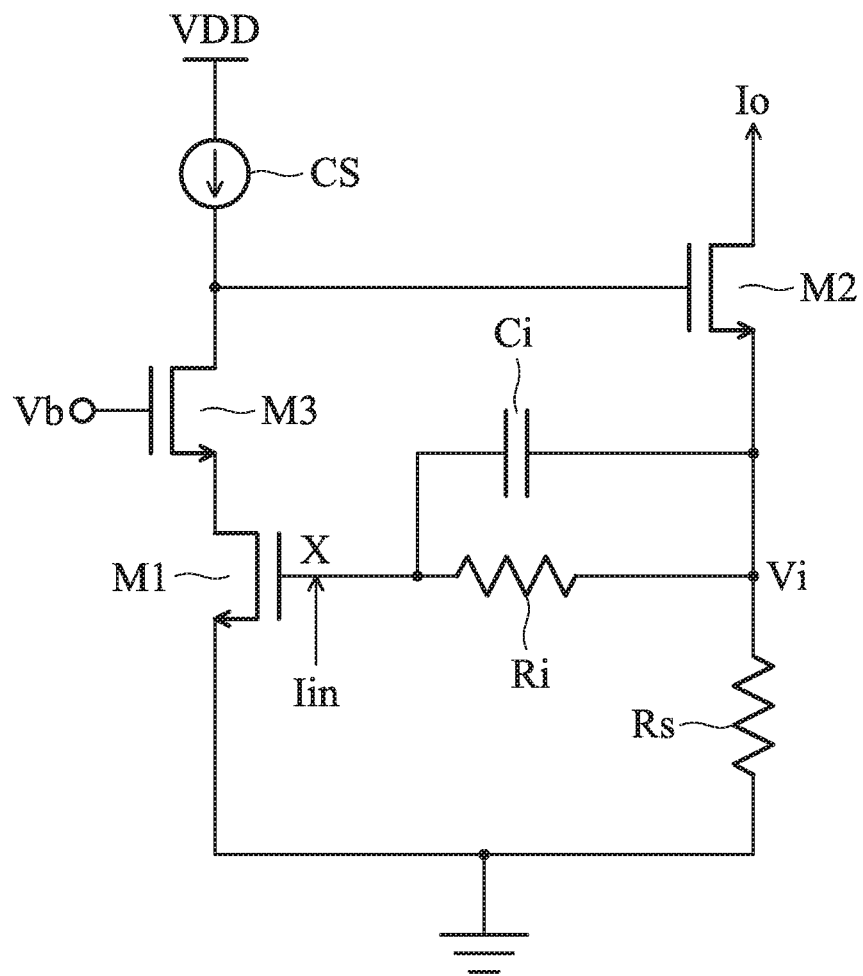
Figure 3C:
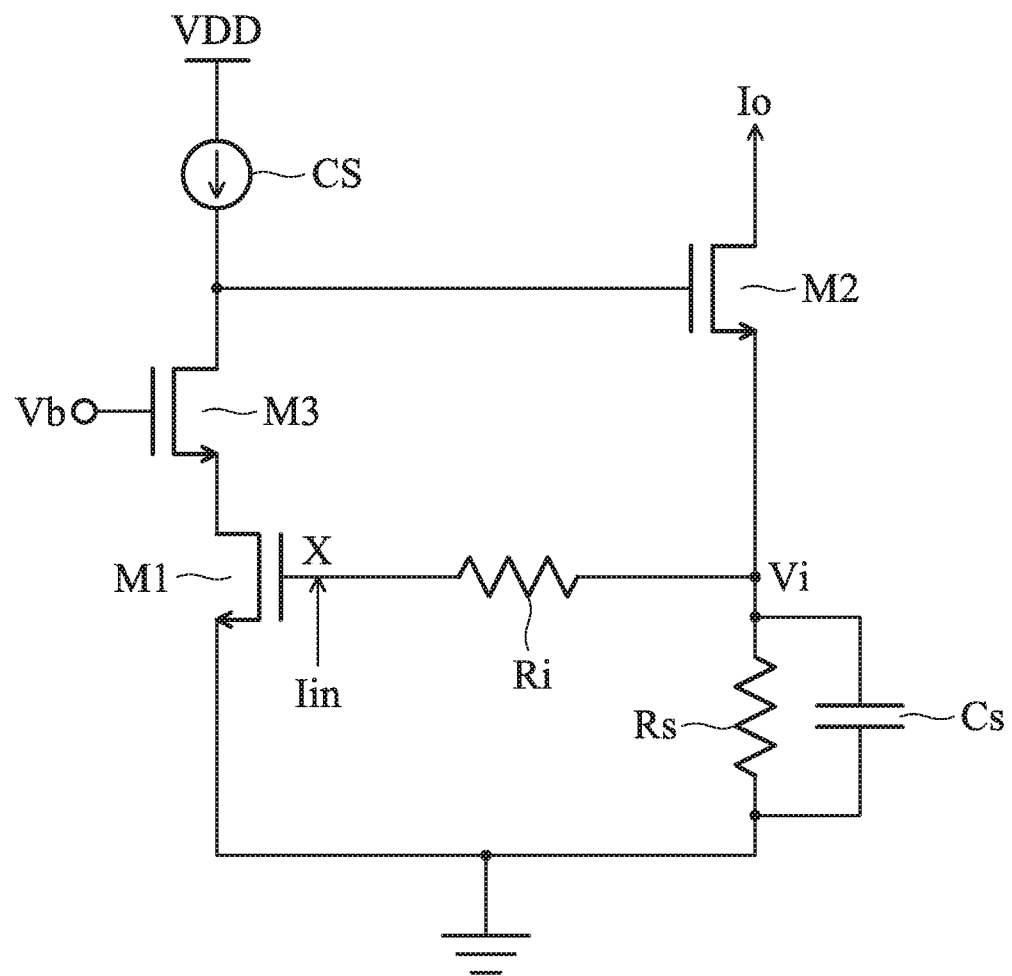

FIGS. 3A to 3C show several current amplifiers in accordance with exemplary embodiments of the disclosure, wherein a transistor M3 is provided, having a gate biased at a bias voltage Vb, a source coupled to the drain of the transistor M1, and a drain coupled to the current source CS with the gate of the transistor M2.

In FIG. 3A, a resistor Ri is coupled between the gate of the transistor M1 and the source of the transistor M2 to implement the impedance circuit Zi of FIG. 1, and a resistor Rs is coupled between the source of the transistor M2 and the ground terminal to implement the impedance circuit Zs of FIG. 1. Because of the feedback network formed by M1, M2, CS, Ri and Rs, the gate voltage of M1 is almost kept constant no matter how much input current Iin is injected into node X. This means that the disclosed current amplifier has a small input impedance. The voltage across Ri varies with Iin and Io=−(1+Ri/Rs)*Iin. The current gain of the current amplifier is controllable by changing the resistance of Ri and Rs. The circuit design is much simpler in comparison with the conventional current amplifier requiring additional active devices for common mode bias.

In comparison to FIG. 3A, FIG. 3B further includes a capacitor Ci connected in parallel with the resistor Ri. The parallel connected Ri and Ci form the impedance circuit Zi of FIG. 1, working as a low pass filter.

In comparison to FIG. 3A, FIG. 3C further includes a capacitor Cs connected in parallel with the resistor Rs. The parallel connected Rs and Cs form the impedance circuit Zs of FIG. 1, working as a high pass filter.

Implementation of the impedance circuits of FIG. 3A to FIG. 3C are not intended to limit the scope of the invention. For example, a band pass function may be provided by using a parallel-connected resistor and capacitor, paired to implement the impedance circuit Zi and a parallel-connected resistor and capacitor, paired to implement the impedance circuit Zs.

Furthermore, a pseudo differential current amplifier is disclosed based on the circuit of FIG. 1.

Figure 4A:
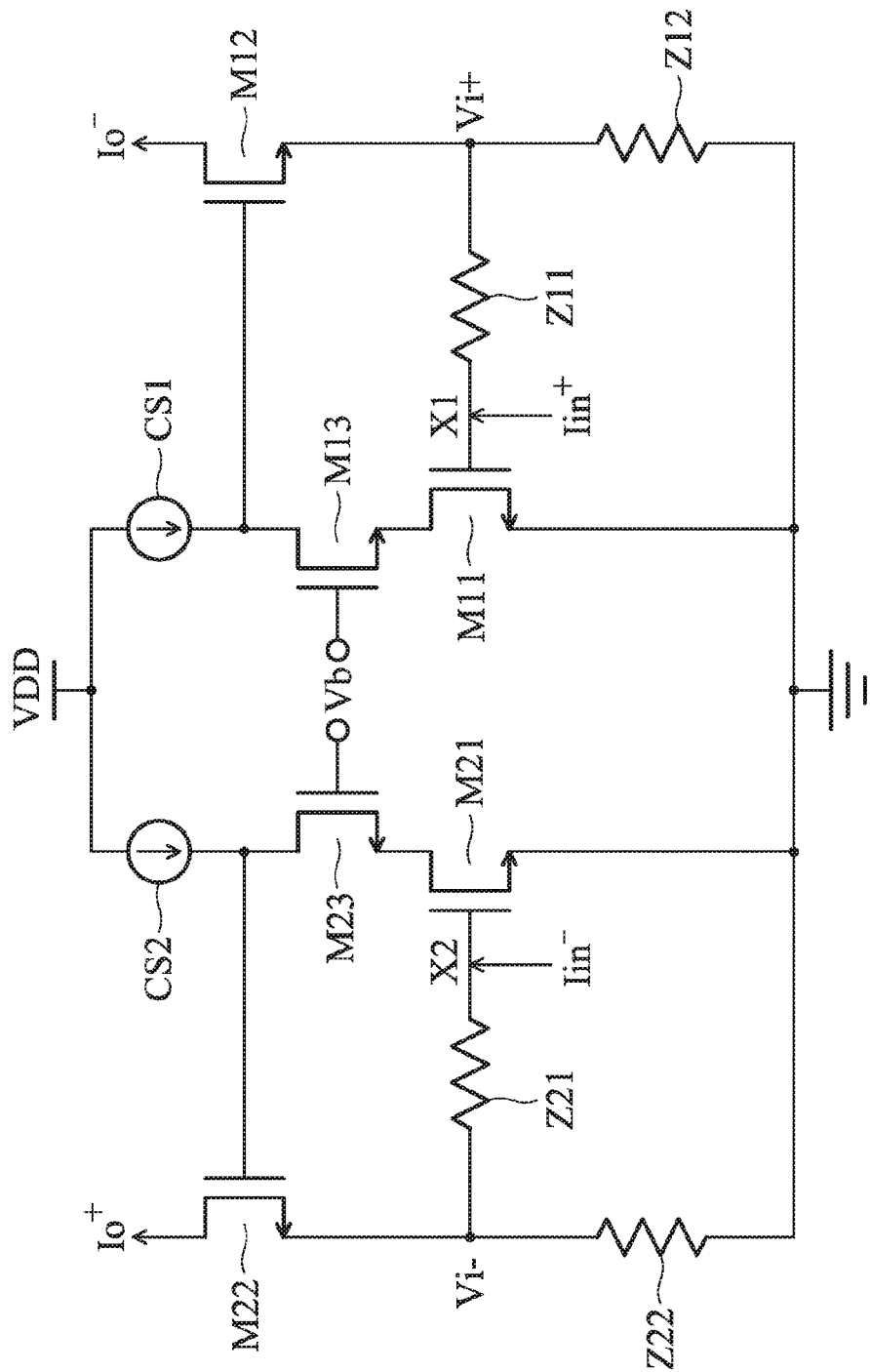
FIG. 4A depicts a current amplifier in a pseudo-differential structure in accordance with an exemplary embodiment of the invention.

FIG. 4A depicts a current amplifier in a pseudo-differential structure in accordance with an exemplary embodiment of the invention. First, the right part of the circuit of FIG. 4A is discussed. The transistor M11 has a gate coupled to a positive output terminal of a former-stage circuit for receiving a positive input current Iin+, a drain coupled to a current source CS1, and a source biased at a constant voltage level (e.g., ground, but not limited thereto). The transistor M12 has a gate coupled to the current source CS1 and has a source and a drain. The impedance circuit Z11 is coupled between the gate of the transistor M11 and the source of the transistor M12. The impedance circuit Z12 is coupled between the source of the transistor M12 and a ground terminal. The transistor M13 is optional, having a gate biased at a bias voltage Vb, a source coupled to the drain of the transistor M11, and a drain coupled to the current source CS1 with the gate of the transistor M12. A negative output current Io− is generated at the drain of the transistor M12.

Next, the left part of the circuit of FIG. 4A is discussed. The transistor M21 has a gate coupled to a negative output terminal of the former-stage circuit for receiving a negative input current Iin−, a drain coupled to a current source CS2, and a source biased at the constant voltage level (as shown, connected at the ground terminal). The transistor M22 has a gate coupled to the current source CS2 and has a source and a drain. The impedance circuit Z21 is coupled between the gate of the transistor M21 and the source of the transistor M22. The impedance circuit Z22 is coupled between the source of the transistor M22 and the ground terminal. The transistor M23 is optional, having a gate biased at the bias voltage Vb, a source coupled to the drain of the transistor M21, and a drain coupled to the current source CS2 with the gate of the transistor M22. A positive output current Io+ is generated at the drain of the transistor M22.

Figure 4B:
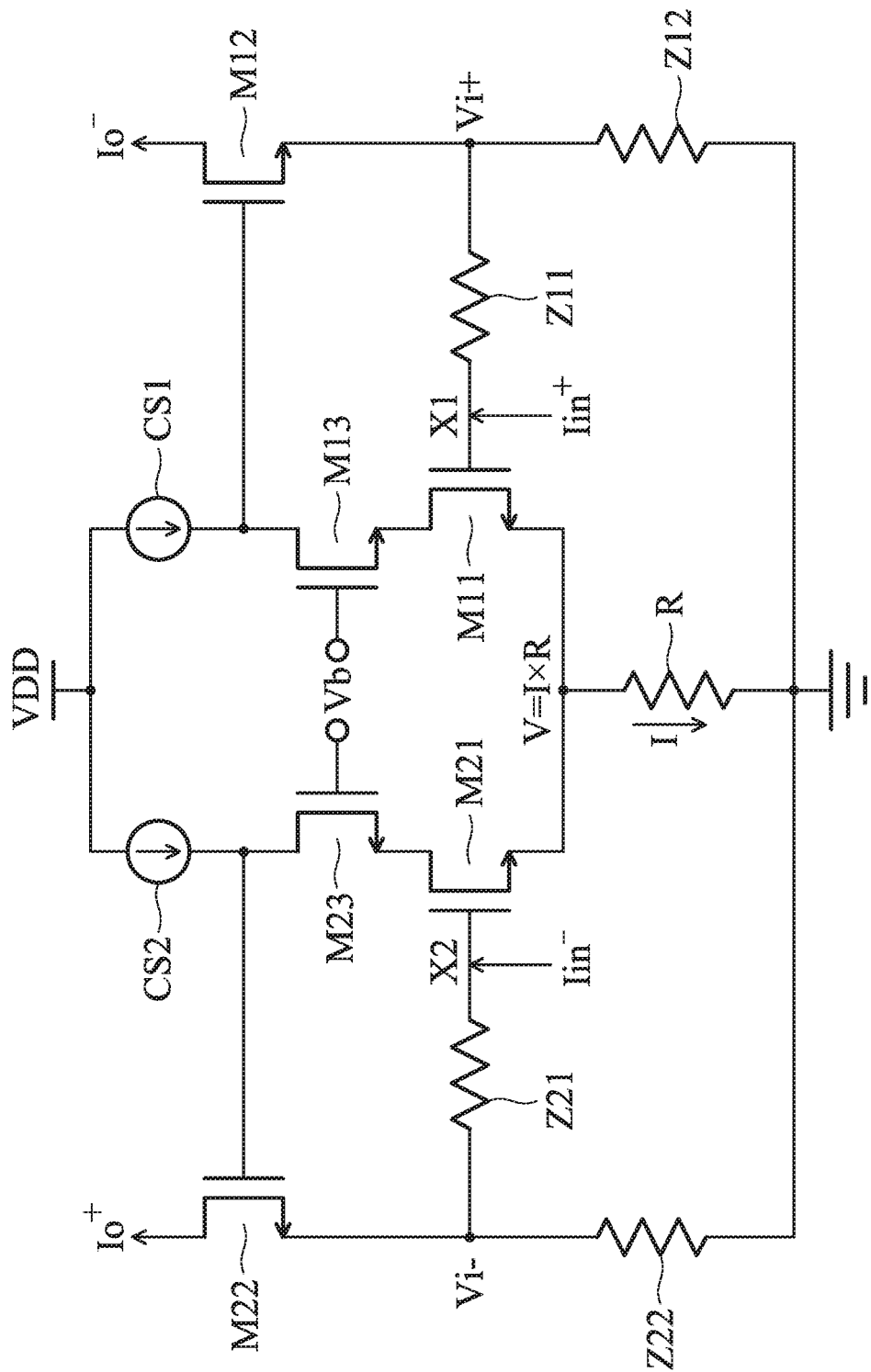
FIG. 4B depicts a current amplifier in a pseudo-differential structure in accordance with another exemplary embodiment of the invention.

FIG. 4B depicts a current amplifier in a pseudo-differential structure in accordance with another exemplary embodiment of the invention. In comparison with the current amplifier of FIG. 4A, the circuit of FIG. 4B further provides a resistor R, coupling the source of the transistor M11 and the source of the transistor M21 to the ground terminal. Thus, the source of the transistor M11 and the source of the transistor M21 are biased at a constant voltage level I*R instead of biasing at the ground level.

The constant voltage level, biasing the source of the transistor M11 and the source of the transistor M21, is not limited to the ground level or the voltage level V (=I*R). Any constant voltage biasing circuit without connecting any current source to the source of the transistor M11 and the source of the transistor M21 is also within the scope of the invention. Because no active device is required at the source of the transistor M11 and the source of the transistor M21, the disclosed pseudo current amplifiers guarantees low noise and high bandwidth when applied to transmission operations.

Figure 5:
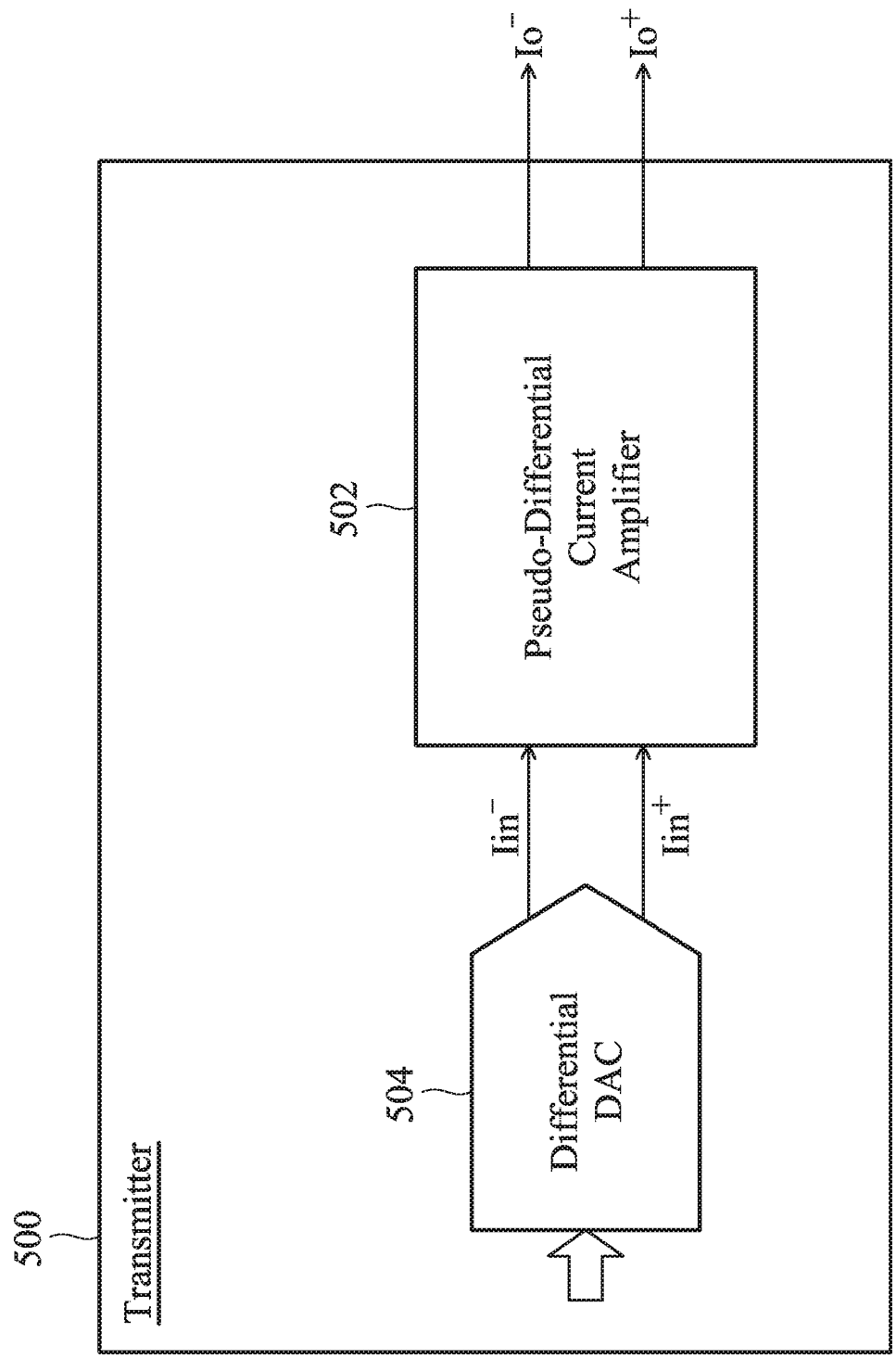
FIG. 5 depicts a transmitter 500 in a differential structure.

In accordance with an exemplary embodiment of the invention, FIG. 5 depicts a transmitter 500 in a differential structure, comprising a pseudo-differential current amplifier 502 and a differential digital-to-analog converter 504. The pseudo-differential current amplifier 502 may be implemented by the circuits of FIG. 4A or FIG. 4B. The differential digital-to-analog converter 504 has a positive output terminal and a negative output terminal providing the pseudo-differential current amplifier 502 with the positive and negative input currents Iin+ and Iin−, respectively.

Figure 6:
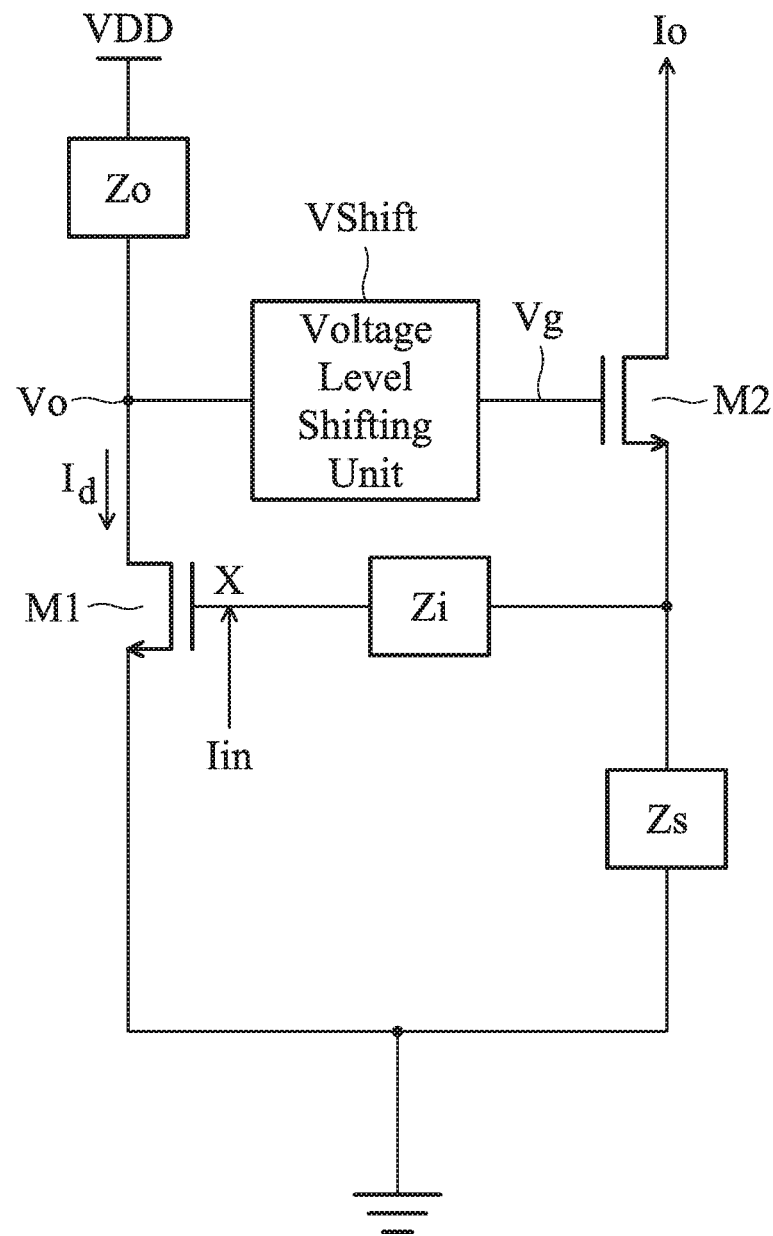
FIG. 6 depicts a current amplifier in accordance with another exemplary embodiment of the invention.

FIG. 6 depicts a current amplifier transforming an input current Iin to an output current To in accordance with another exemplary embodiment of the invention. In comparison with FIG. 1, the current amplifier of FIG. 6 further includes a voltage level shifting unit VShift coupled between the gate of the transistor M2 and the drain of the transistor M1 to provide a voltage shift. The drain of the transistor M1 receives a driving current Id. In one embodiment, the voltage level shifting unit Vshift is used to make the transistor M1 operate in a saturation region. Thus, the current amplifier of FIG. 6 can operate at a desirable direct current voltage, and the operations of the impedance structure Zo (e.g., a current source) and the operations of the transistor M1 are not suppressed by the gate voltage Vg of the transistor M2. As shown, the voltage level shifting unit VShift pulls up/down the gate voltage Vg of the gate of the transistor M2 to generate a voltage level Vo to be coupled to the drain of the transistor M1 to ensure that the transistor M1 operates in a saturation region.

In the exemplary embodiment of FIG. 6, the source of the transistor M1 is coupled to the ground terminal. In some exemplary embodiments, the source of the transistor M1 is biased at a constant voltage level. In some exemplary embodiments, no active device is connected to the source of the transistor M1.

Figure 7:
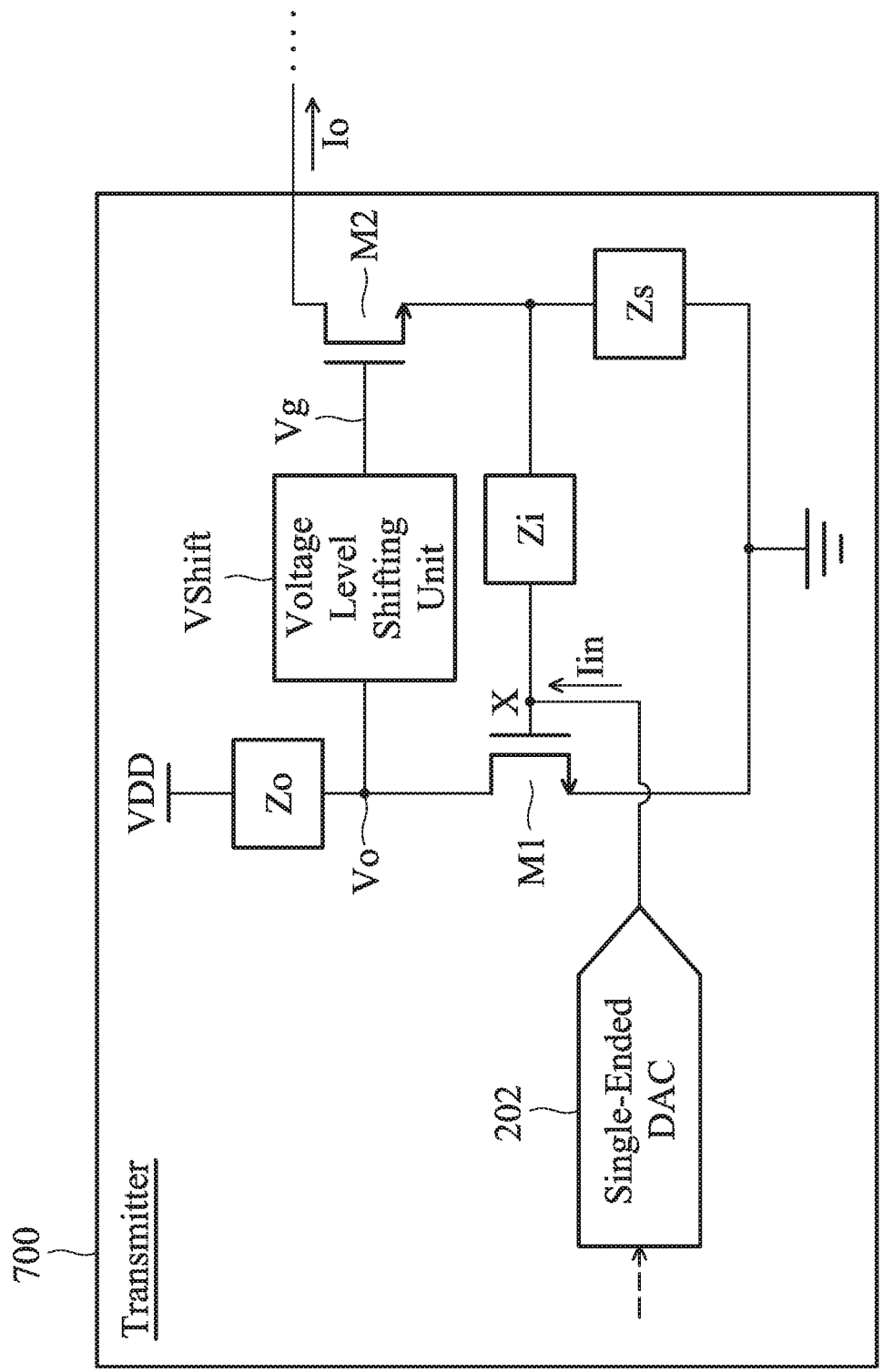
FIG. 7 depicts a single ended design transmitter 700.

FIG. 7 depicts a single ended design transmitter 700. The transmitter 700 comprises the current amplifier of FIG. 6 and the single-ended digital-to-analog converter 202. The output of the single-ended digital-to-analog converter 202 is coupled to the gate of the transistor M1 of the current amplifier. Via node X, the single-ended digital-to-analog converter 202 provides the current amplifier with an input current Iin, and a single output current Io is generated by the current amplifier to be coupled for current-to-voltage transformation.

Figure 8:
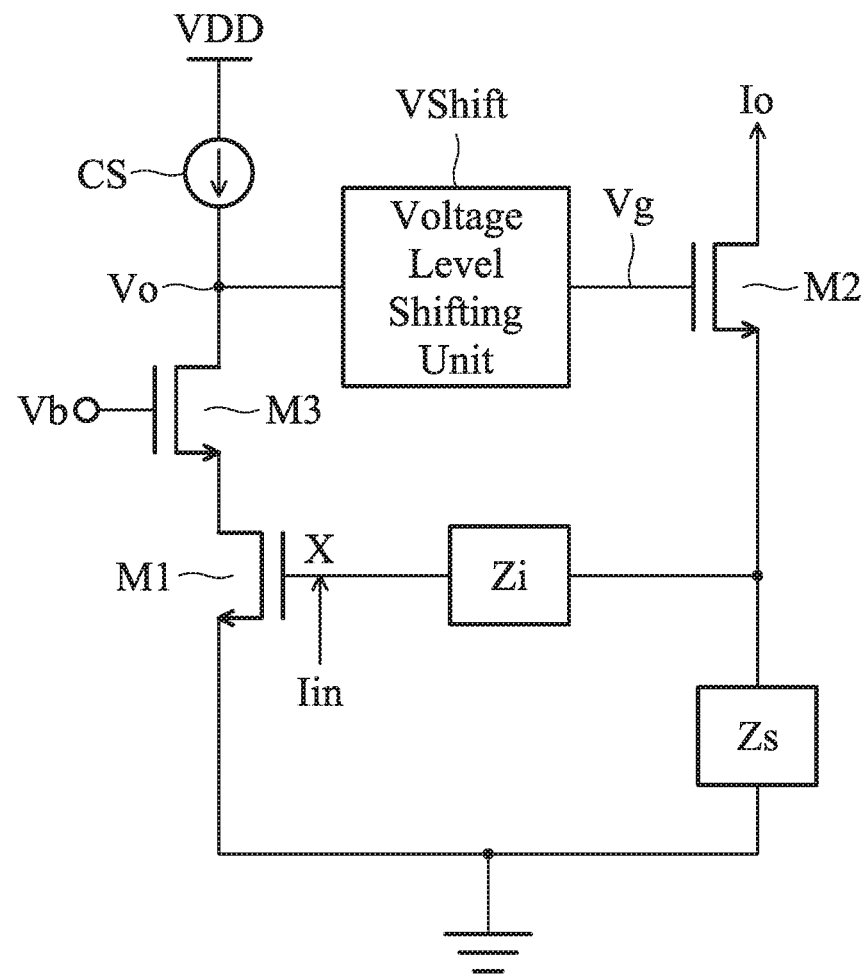
FIG. 8 shows another kind of current amplifier that further comprises a transistor M3 in comparison with the current amplifier of FIG. 6.

FIG. 8 shows another exemplary embodiment of current amplifier that further comprises a transistor M3 in comparison with the current amplifier of FIG. 6. The transistor M3 has a gate biased by a bias voltage Vb, a source coupled to the drain of the transistor M1, and a drain. The voltage level shifting unit VShift is coupled to the drain of the transistor M3, and the source of the transistor M3 is coupled to the drain of the transistor M1. The voltage level Vo with a voltage shift from the gate voltage Vg of the transistor M2 is applied to the drain of the transistor M3. The impedance circuits Zi and Zs may be those shown in FIGS. 3A to 3C or in any filter architecture.

Figure 9A:
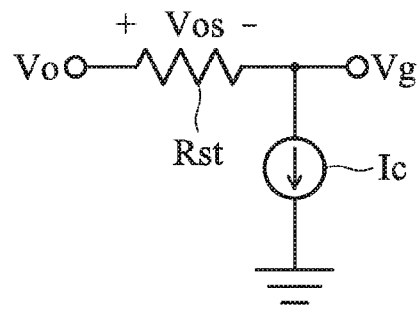
FIGS. 9A to 9D show several kinds of voltage level shifting units VShift.
Figure 9B:
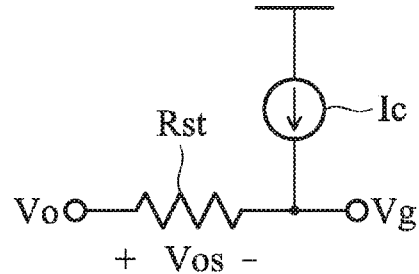
Figure 9C:
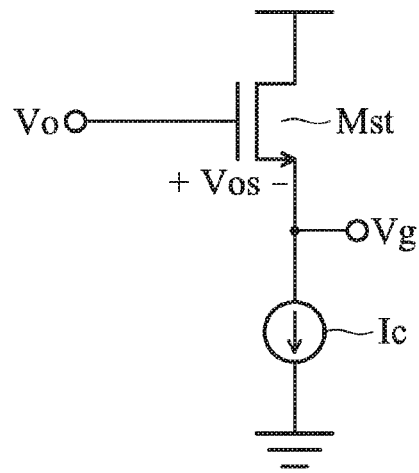
Figure 9D:
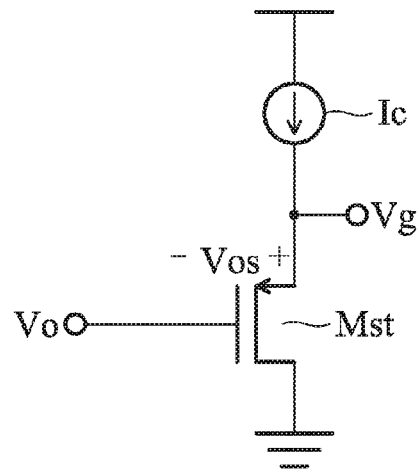

FIGS. 9A to 9D show several kinds of voltage level shifting units VShift. In FIG. 9A and FIG. 9B, a voltage level shifting unit VShift comprises a resistor Rst and a current source Ic. In FIG. 9A, the voltage shift Vos is a positive value and the gate voltage Vg is shifted to a higher voltage level Vo. In FIG. 9B, the voltage difference Vos is a negative value and the gate voltage Vg is shifted to a lower voltage level Vo. In FIG. 9C and FIG. 9D, a voltage level shifting unit VShift comprises a transistor Mst and a current source Ic. In FIG. 9C (an NMOS follower), the gate voltage Vg is shifted to a higher voltage level Vo by the voltage difference Vos between the gate and the source of the transistor Mst. In FIG. 9D (a PMOS follower), the gate voltage Vg is shifted to a lower voltage level Vo by the voltage difference Vos between the source and the gate of the transistor Mst.

Figure 10A:
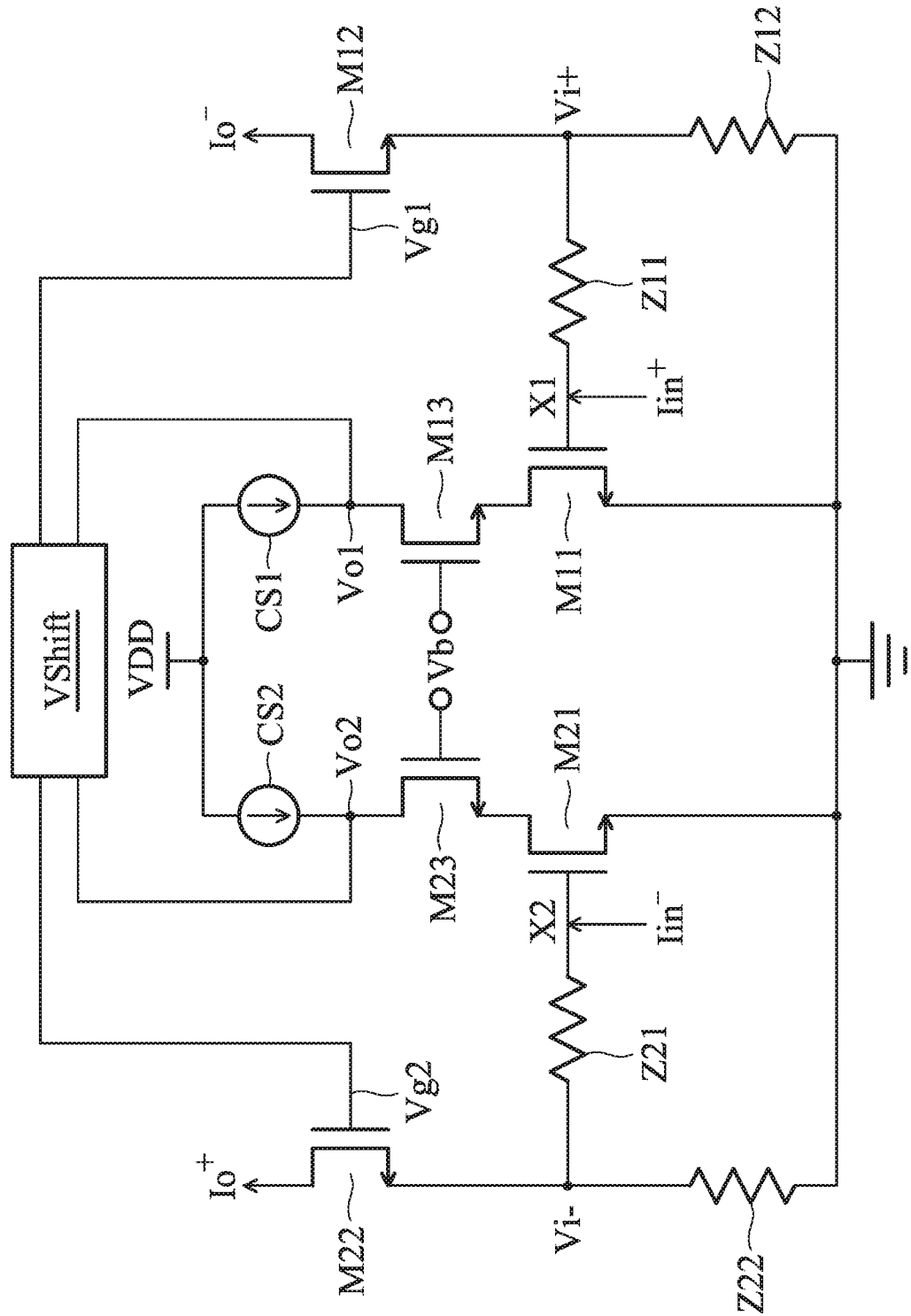
FIG. 10A and FIG. 10B depict pseudo-differential current amplifiers with the voltage level shifting mechanism.
Figure 10B:
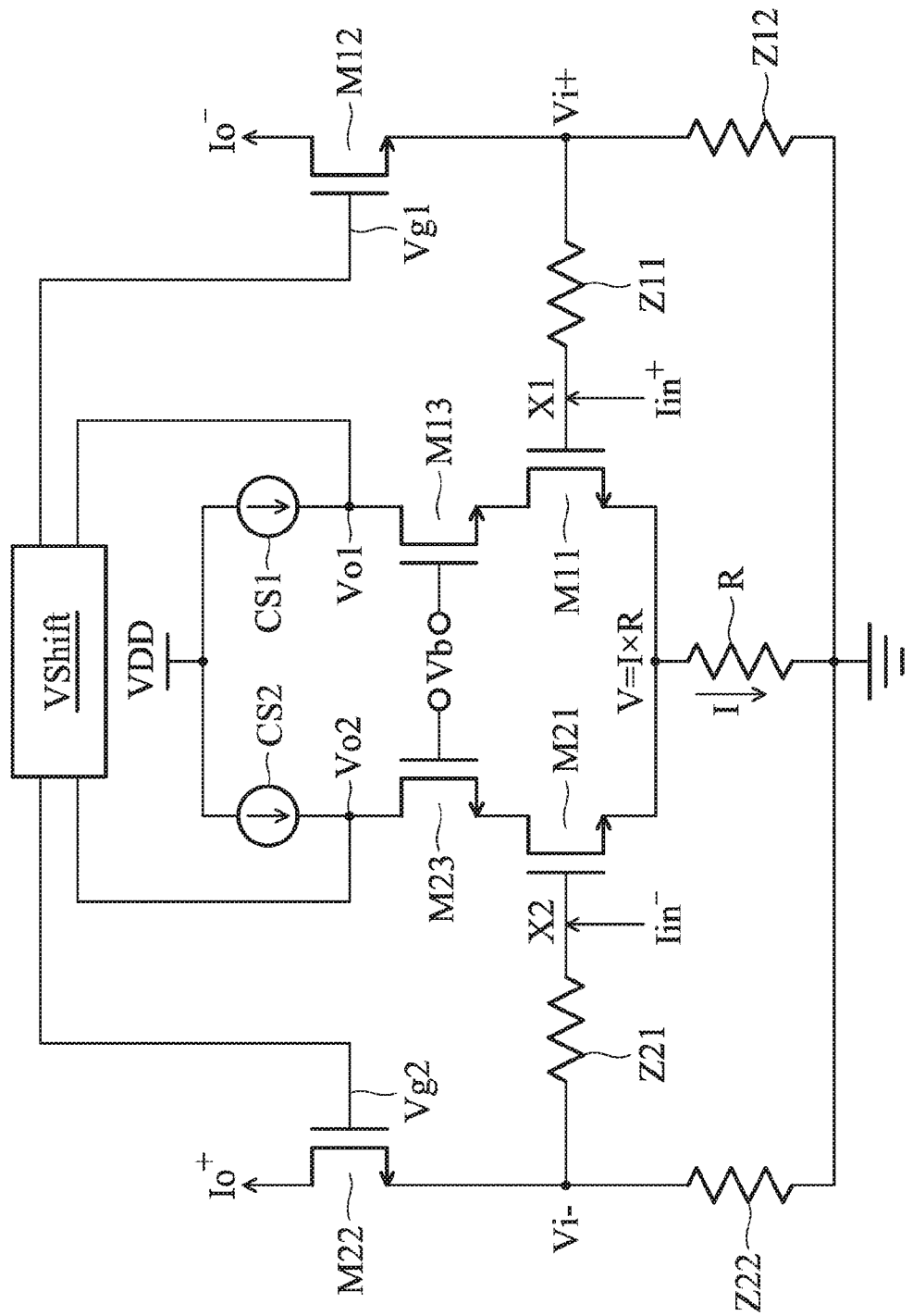

FIG. 10A and FIG. 10B depict pseudo-differential current amplifiers with the voltage level shifting mechanism. In comparison with FIG. 4A and FIG. 4B, the voltage level shifting unit VShift pulls up/down a gate voltage Vg1 of the gate of the transistor M12 and a gate voltage Vg2 of the gate of the transistor M22 to generate the voltage levels Vo1 and Vo2. In one embodiment, the voltage level Vo1 coupled to the drain of the transistor M11 via the transistor M13 is provided so that the transistor M11 is operating in the saturation region. The voltage level Vo2 coupled to the drain of the transistor M21 via the transistor M23 is provided so that the transistor M21 is operating in the saturation region.

In the exemplary embodiment of FIG. 10A, the source of the transistor M11 and the source of the transistor M21 are coupled to the ground terminal. In some exemplary embodiments, the source of the transistor M11 and the source of the transistor M21 are biased at a fixed voltage level.

Referring back to FIG. 5, the pseudo-differential current amplifier 502 may be implemented by the pseudo-differential current amplifiers with the voltage level shifting mechanism. A transmitter using the high linearity pseudo-differential current amplifier with a differential DAC is also in the scope of the disclosure.

Figure 11A:
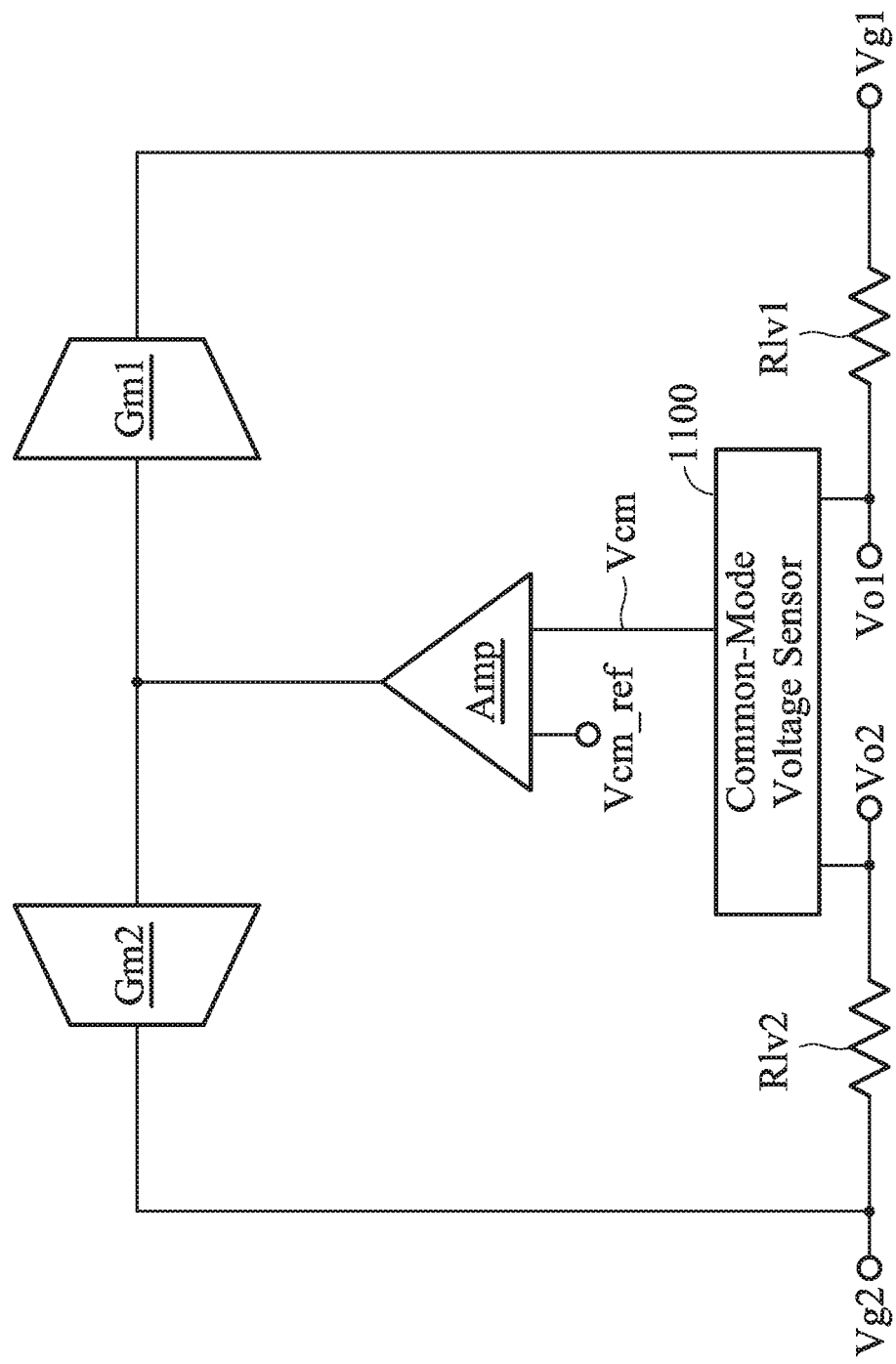
FIG. 11A and FIG. 11B depict two kinds of voltage level shifting units VShift for a pseudo differential architecture.
Figure 11B:
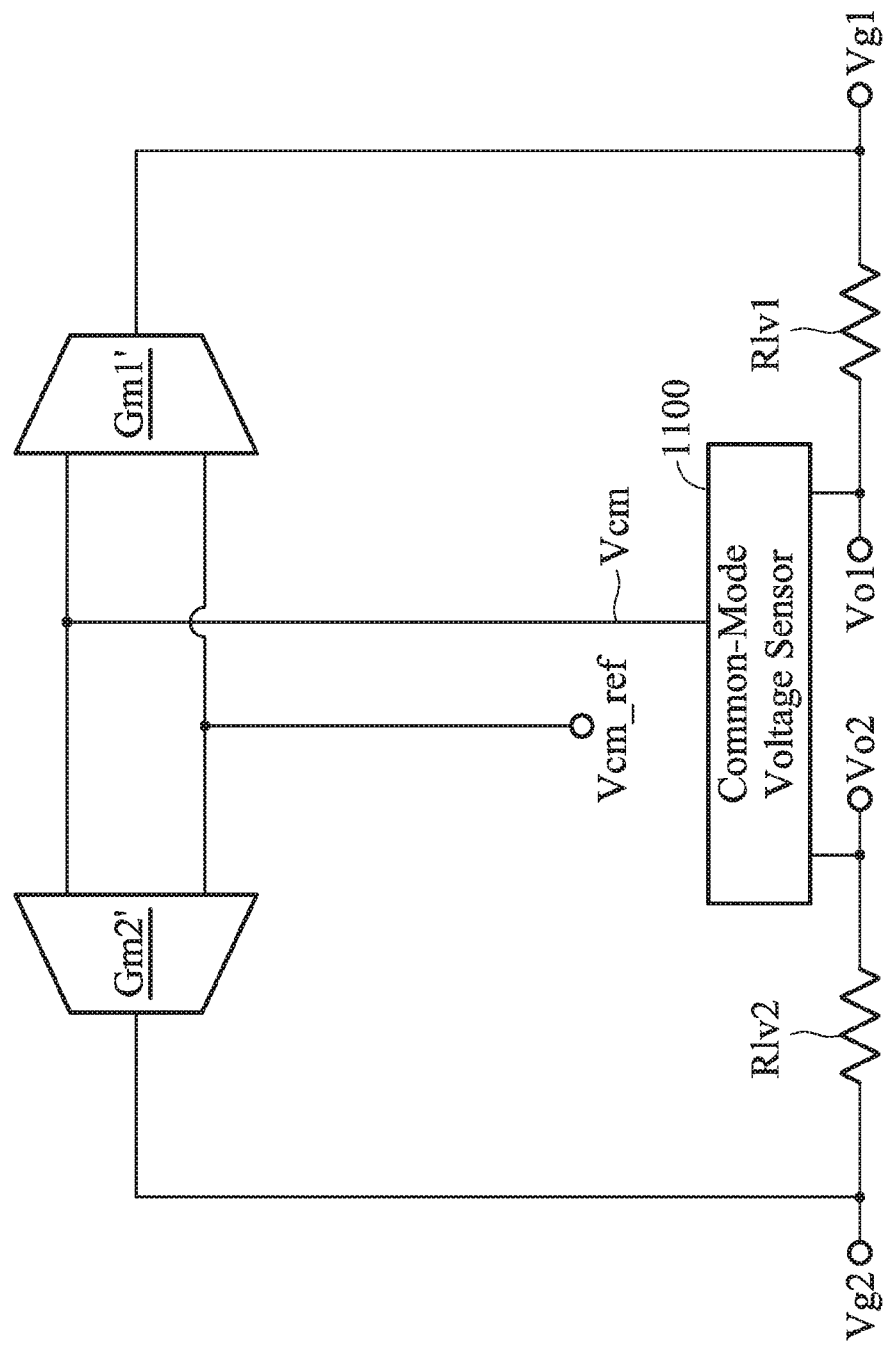

FIG. 11A and FIG. 11B depict two kinds of voltage level shifting units VShift for the pseudo differential architecture.

In FIG. 11A, the voltage level shifting unit VShift comprises a common mode voltage sensor 1100, an operational amplifier Amp, two trans-conductance amplifiers Gm1 and Gm2 and two resistors Rlv1 and Rlv2. A common-mode voltage Vcm between the voltage levels Vo1 and Vo2 is extracted by the common mode voltage sensor 1100 and sent to the operational amplifier Amp to be compared with a common-mode voltage reference Vcm_ref. The output signal of the operational amplifier Amp is coupled to the two trans-conductance amplifiers Gm1 and Gm2 respectively to be transformed into currents flowing through the resistors Rlv1 and Rlv2 to generate a voltage shift between the gate voltage Vg1 (of the transistor M12) and the voltage level Vo1 and a voltage shift between the gate voltage Vg2 (of the transistor M22) and the voltage level Vo2. The common-mode voltage Vcm between the voltage levels Vo1 and Vo2 may be finally locked to the common-mode voltage reference Vcm_ref to ensure that the transistors M11 and M21 are operating in the saturation region.

In FIG. 11B, the voltage level shifting unit VShift comprises a common mode voltage sensor 1100, two trans-conductance amplifiers Gm1' and Gm2' and two resistors Rlv1 and Rlv2. Each of the trans-conductance amplifiers Gm1' and Gm2' has two inputs, one receiving the common-mode voltage reference Vcm_ref and the other one receiving the common-mode voltage Vcm (between the voltage levels Vo1 and Vo2) extracted by the common mode voltage sensor 1100. Based on the voltage difference between the common-mode voltage Vcm and the common-mode voltage reference Vcm_ref, the two trans-conductance amplifiers Gm1' and Gm2' determine the currents flowing through the resistors Rlv1 and Rlv2 to generate a voltage shift between the gate voltage Vg1 (of the transistor M12) and the voltage level Vo1 and a voltage shift between the gate voltage Vg2 (of the transistor M22) and the voltage level Vo2. The common-mode voltage Vcm between the voltage levels Vo1 and Vo2 may be finally locked to the common-mode voltage reference Vcm_ref to ensure that the transistors M11 and M21 are operating in the saturation region.

Figure 12:
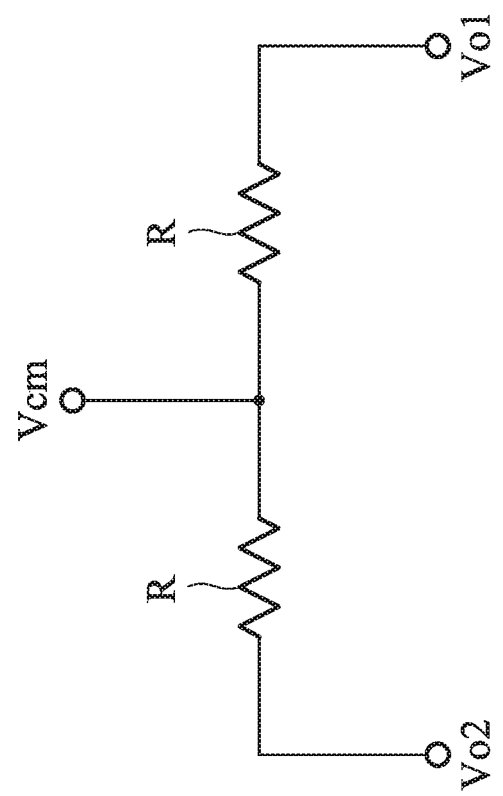
FIG. 12 shows an exemplary embodiment of the common mode voltage sensor 1100.

FIG. 12 shows an exemplary embodiment of the common mode voltage sensor 1100, which comprises two resistors of the same resistance (both 'R'). The common-mode voltage Vcm between the voltage levels Vo1 and Vo2 is extracted from the connection node between the two identical resistors.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A current amplifier, comprising:
   a first transistor, having a gate for receiving an input current, a drain for receiving a driving current, and a source;
   a second transistor, having a gate, a source and a drain;
   a voltage level shifting unit, providing a voltage shift and coupled between the drain of the first transistor and the gate of the second transistor, wherein the voltage level shifting unit comprises a current source;
   wherein the current amplifier generates an output current at the drain of the second transistor, and wherein no active device is connected to the source of the first transistor.

2. The current amplifier of claim 1, wherein the voltage level shifting unit is configured to ensure that the first transistor operates in a saturation region.

3. The current amplifier as claimed in claim 1, further comprising:
   a first impedance circuit, coupled between the gate of the first transistor and the source of the second transistor; and
   a second impedance circuit, coupled between the source of the second transistor and a ground terminal.

4. The current amplifier as claimed in claim 1, wherein the source of the first transistor is directly connected to a ground terminal.

5. The current amplifier as claimed in claim 1, wherein the source of the first transistor is biased at a fixed voltage level.

6. The current amplifier as claimed in claim 1, further comprising:
   a third transistor, having a gate biased at a bias voltage, a source coupled to the drain of the first transistor, and a drain,
   wherein the voltage level shifting unit is coupled to the drain of the third transistor to couple to the drain of the first transistor.

7. The current amplifier as claimed in claim 1, wherein the voltage level shifting unit comprises:
   a resistor; and
   a current source, providing a current flowing through the resistor to generate the voltage shift across the resistor.

8. A current amplifier, comprising:
   a first transistor, having a gate for receiving an input current, a drain for receiving a driving current, and a source directly connected to ground;
   a second transistor, having a gate, a source and a drain, wherein the source of the second transistor is connected to the gate of the first transistor through an impedance circuit;
   a voltage level shifting unit, providing a voltage shift and coupled between the drain of the first transistor and the gate of the second transistor;
   wherein the current amplifier generates an output current at the drain of the second transistor, wherein the voltage level shifting unit is an NMOS source follower or a PMOS source follower.

9. A transmitter, comprising:
   the current amplifier as claimed in claim 1; and
   a single-ended digital-to-analog converter, having a single output coupled to the gate of the first transistor of the current amplifier.

10. The transmitter as claimed in claim 9, wherein the drain of the second transistor of the current amplifier is coupled to a load impedance and thereby the output current is transformed into a voltage value.

11. A current amplifier, comprising:
    a first transistor, having a gate receiving a positive input current, a drain receiving a first driving current, and a source;
    a second transistor, having a gate, a source and a drain;
    a third transistor, having a gate coupled to a former-stage circuit, a drain receiving a second driving current, and a source;
    a fourth transistor, having a gate, a source and a drain;
    a voltage level shifting unit, providing a first voltage shift and coupled between the drain of the first transistor and the gate of the second transistor, and further providing a second voltage shift and coupled between the drain of the third transistor and the gate of the fourth transistor,
    wherein the current amplifier generates a negative output current and a positive output current at the drain of the second transistor and the drain of the fourth transistor, respectively.

12. The current amplifier as claimed in claim 11, wherein the first voltage shift provided by the voltage level shifting unit is utilized to ensure that the first transistor operates in a saturation region and the second voltage shift provided by the voltage level shifting unit is utilized to ensure that the third transistor operates in the saturation region.

13. The current amplifier as claimed in claim 11, further comprising:
    a first impedance circuit, coupled between the gate of the first transistor and the source of the second transistor;
    a second impedance circuit, coupled between the source of the second transistor and a ground terminal;
    a third impedance circuit, coupled between the gate of the third transistor and the source of the fourth transistor; and
    a fourth impedance circuit, coupled between the source of the fourth transistor and the ground terminal.

14. The current amplifier as claimed in claim 11, wherein the source of the first transistor and the source of the third transistor are directly connected to a ground terminal.

15. The current amplifier as claimed in claim 11, wherein the source of the first transistor and the source of the third transistor are biased at a fixed voltage level.

16. The current amplifier as claimed in claim 11, wherein no active device is connected to the source of the first transistor and no active device is connected to the source of the third transistor.

17. The current amplifier as claimed in claim 11, further comprising:
a first-third transistor, having a gate biased at a bias voltage, a source coupled to the drain of the first transistor, and a drain; and
a second-third transistor, having a gate biased at the bias voltage, a source coupled to the drain of the third transistor and a drain,
wherein:
the voltage level shifting unit is coupled to the drain of the first-third transistor to couple to the drain of the first transistor; and
the voltage level shifting unit is coupled to the drain of the second-third transistor to couple to the drain of the third transistor.

18. The current amplifier as claimed in claim 11, wherein the voltage level shifting unit comprises:
a first resistor, having a first terminal coupled to the gate of the second transistor and a second terminal outputting a first voltage level;
a second resistor, having a first terminal coupled to the gate of the fourth transistor and a second terminal outputting a second voltage level;
a common mode voltage sensor, extracting a common-mode voltage between the first voltage level and the second voltage level;
an operational amplifier, comparing the common-mode voltage with a common-mode voltage reference and having an output terminal;
a first trans-conductance amplifier, having an input terminal coupled to the output terminal of the operational amplifier and an output terminal coupled to the gate of the second transistor; and
a second trans-conductance amplifier, having an input terminal coupled to the output terminal of the operational amplifier and an output terminal coupled to the gate of the fourth transistor,
wherein:
the voltage level shifting unit generates the first voltage shift across the first resistor; and
the voltage level shifting unit generates the second voltage shift across the second resistor.

19. The current amplifier as claimed in claim 18, wherein the common mode voltage sensor comprises:
a third resistor, having a first terminal coupled the first voltage level and a second terminal; and
a second resistor, having a first terminal coupled to the second voltage level and a second terminal,
the second terminal of the third resistor and the second terminal of the fourth resistor are connected together to provide the common-mode voltage extracted from the first voltage level and the second voltage level.

20. The current amplifier as claimed in claim 11, wherein the voltage level shifting unit comprises:
a first resistor, having a first terminal coupled to the gate of the second transistor and a second terminal outputting a first voltage level;
a second resistor, having a first terminal coupled to the gate of the fourth transistor and a second terminal outputting a second voltage level;
a common mode voltage sensor, extracting a common-mode voltage between the first voltage level and the second voltage level;
a first trans-conductance amplifier, receiving the common-mode voltage and a common-mode voltage reference and having an output terminal coupled to the gate of the second transistor; and
a second trans-conductance amplifier, receiving the common-mode voltage and the common-mode voltage reference and having an output terminal coupled to the gate of the fourth transistor,
wherein:
the voltage level shifting unit generates the first voltage shift across the first resistor; and
the voltage level shifting unit generates the second voltage shift across the second resistor.

21. The current amplifier as claimed in claim 20, wherein the common mode voltage sensor comprises:
a third resistor, having a first terminal coupled the first voltage level and a second terminal; and
a second resistor, having a first terminal coupled to the second voltage level and a second terminal,
the second terminal of the third resistor and the second terminal of the fourth resistor are connected together to provide the common-mode voltage extracted from the first voltage level and the second voltage level.

22. A transmitter, comprising:
the current amplifier as claimed in claim 11; and
a differential digital-to-analog converter, having a positive output terminal coupled to the gate of the first transistor of the current amplifier and having a negative output terminal coupled to the gate of the third transistor of the current amplifier.

23. The transmitter as claimed in claim 12, wherein the drain of the second transistor and the drain of the fourth transistor of the current amplifier are coupled to a load impedance for a current-to-voltage transformation.

* * * * *